US010971693B2

(12) United States Patent
Wang et al.

(10) Patent No.: US 10,971,693 B2
(45) Date of Patent: Apr. 6, 2021

(54) LIGHT EMITTING DEVICES, METHODS FOR PREPARING THE SAME, AND DISPLAY DEVICES

(71) Applicants: Kunshan New Flat Panel Display Technology Center Co., Ltd., Kunshan (CN); Kunshan Go-Visionox Opto-Electronics Co., Ltd., Kunshan (CN)

(72) Inventors: Jiantai Wang, Kunshan (CN); Rubo Xing, Kunshan (CN); Xiaolong Yang, Kunshan (CN); Huimin Liu, Kunshan (CN); Ping Sun, Kunshan (CN); Dong Wei, Kunshan (CN)

( * ) Notice: Subject to any disclaimer, the term of this patent is extended or adjusted under 35 U.S.C. 154(b) by 0 days.

(21) Appl. No.: 16/576,779

(22) Filed: Sep. 20, 2019

(65) Prior Publication Data

US 2020/0013977 A1   Jan. 9, 2020

Related U.S. Application Data

(63) Continuation of application No. PCT/CN2018/088747, filed on May 28, 2018.

(30) Foreign Application Priority Data

Mar. 2, 2018   (CN) .......................... 201810175428.8

(51) Int. Cl.
*H01L 51/50*   (2006.01)
*H01L 51/56*   (2006.01)

(52) U.S. Cl.
CPC ........ *H01L 51/502* (2013.01); *H01L 51/5068* (2013.01); *H01L 51/5084* (2013.01); *H01L 51/5092* (2013.01); *H01L 51/56* (2013.01)

(58) Field of Classification Search
CPC combination set(s) only.
See application file for complete search history.

(56) References Cited

U.S. PATENT DOCUMENTS 10,158,094 B2   12/2018   Lee et al.
2014/0185640 A1*   7/2014   Jain .................. H01S 5/021
372/45.011

(Continued)

FOREIGN PATENT DOCUMENTS

| CN | 102110783 A | 6/2011 |
| CN | 103972416 A | 8/2014 |

(Continued)

OTHER PUBLICATIONS

CN First Office Action with search report dated Dec. 26, 2019 in the corresponding CN application (application No. 201810175428.8).

(Continued)

*Primary Examiner* — Mamadou L Diallo
(74) *Attorney, Agent, or Firm* — Kilpatrick Townsend & Stockton

(57) ABSTRACT

The present disclosure relates to a light emitting device, a method for preparing the same and a display device. The light emitting device includes a cathode layer, a quantum dot light emitting layer, a hole injection layer and an anode layer which are laminated. The hole injection layer includes a complex metal oxide film comprising two metal oxides that is at least partially oxidated.

15 Claims, 3 Drawing Sheets

(56) References Cited

U.S. PATENT DOCUMENTS

2019/0055465 A1* 2/2019 Park .................. C08L 33/10
2019/0103571 A1* 4/2019 Dong ................. H01L 33/06
2020/0321548 A1* 10/2020 Wu .................... H01L 51/50

FOREIGN PATENT DOCUMENTS

| CN | 105140394 | A | 12/2015 |
| --- | --- | --- | --- |
| CN | 106252521 | A | 12/2016 |
| CN | 103972416 | B | 2/2017 |
| CN | 106374051 | A | 2/2017 |
| CN | 106601922 | A | 4/2017 |
| CN | 107689422 | A | 2/2018 |
| JP | 2824411 | B2 | 11/1998 |
| TW | 201248894 | A1 | 12/2012 |

OTHER PUBLICATIONS

TW First Office Action dated Aug. 23, 2018 in the corresponding TW application (application No. 107121931).
TW First Office Action dated Nov. 30, 2018 in the corresponding TW application (application No. 107121931).

* cited by examiner

LIGHT EMITTING DEVICES, METHODS FOR PREPARING THE SAME, AND DISPLAY DEVICES

CROSS-REFERENCES TO RELATED APPLICATIONS

This application is a continuation application of International Application PCT/CN2018/088747, filed on May 28, 2018, which claims the priority benefit of Chinese Patent Application No. 201810175428.8, titled "LIGHT EMITTING DEVICES, METHODS FOR PREPARING THE SAME, AND DISPLAY DEVICES" and filed on Mar. 2, 2018. The entireties of both applications are incorporated by reference herein for all purposes.

TECHNICAL FIELD

The present disclosure relates to the field of display.

BACKGROUND

Quantum dot light emitting diodes (QLED) have great potential in display because of their advantages, such as high color gamut, high color purity, long service life, capability of being prepared in a printing process, and the like, making them a favorable competitor for next-generation display technology.

SUMMARY

Based on this, it is necessary to provide a light emitting device and a display device in view of the above technical problems.

A light emitting device comprises a cathode layer, a quantum dot light emitting layer, a hole injection layer and an anode layer which are laminated, and the hole injection layer comprises a complex metal oxide film comprising two metal oxides that is at least partially oxidated.

In the above light emitting device, since the complex metal oxide film comprises at least two metal oxides, the influence of deposition condition and the property of the material itself on the single material of the hole injection layer is reduced. In addition, the synergistic effect brought by the interaction between various metal oxides can further adjust the performance of the interface and thus improve performance of the device. In addition, the partial oxidation of the two metal oxides makes them both semiconducting and metallic, and the hole injection layer thus prepared has better injection capability, greatly improving performance of the device.

In an exemplary embodiment, the metal oxide comprises at least a P-type metal oxide and an N-type metal oxide; or the complex metal oxide film comprises a metal oxide capable of forming a p-n heterojunction.

In an exemplary embodiment, the complex metal oxide film comprises NiOx and MoO3-y, wherein both x and y are not greater than 1.

In an exemplary embodiment, the anode layer has a material comprising at least one of gold and nickel.

In an exemplary embodiment, the light emitting device further comprises at least one of an electron transport layer, an electron injection layer, and a hole transport layer.

The present disclosure also provides a method for preparing a light emitting device comprising:
providing a cathode layer,
depositing a quantum dot light emitting layer on the cathode layer,
depositing a hole injection layer on the quantum dot light emitting layer,
depositing an anode layer on the hole injection layer;
the hole injection layer comprises a complex metal oxide film comprising two metal oxides that is at least partially oxidated.

Depositing the hole injection layer comprises first depositing a complex metal layer, and then performing at least partial oxidation treatment on the composite metal layer to form a complex metal oxide film.

In an exemplary embodiment, depositing the complex metal layer comprises depositing respective metals by vapor co-deposition or co-sputtering.

In an exemplary embodiment, the complex metal layer comprises at least two transition metals.

oxidation treatment, an anodization treatment, and an air annealing oxidation treatment.

In the above preparation method, the complex metal oxide film in the hole injection layer is prepared in a manner of depositing before oxidating, such that the surface of the deposited complex metal layer may be partially oxidated, which is advantageous for the complex metal layer to form a complete film. In addition, compared with the manner of depositing after oxidating, the distance between the metals in the complex metal layer can be greatly shortened in a manner of depositing before oxidating, and thus the contact interface between the metals is larger, which enhances the synergistic effect between the metals, further adjusts performance of the interface and improves performance of the device.

The present disclosure also provides a display device comprising any of above the light emitting device, or the light emitting device prepared by any of the above-described preparation methods.

In the above display device, since the hole injection layer in the light emitting device comprises at least two metal oxides, the influence of deposition condition and the property of the material itself on the single material of the hole injection layer may be reduced. In addition, the synergistic effect brought by the interaction between various metal oxides can further adjust the performance of the interface and thus improve performance of the device. In addition, the partial oxidation of the two metal oxides makes them both semiconducting and metallic, and the hole injection layer thus prepared has better injection capability, greatly improving performance of the device. In addition, the surface of the deposited complex metal layer may be partially oxidated in a manner of depositing before oxidating, which is not only advantageous for the complex metal layer to form a complete film, but also greatly shorten the distance between the metals in the complex metal layer, and thus the contact interface between the metals is larger, which enhances the synergistic effect between the metals, further adjusts performance of the interface and improves performance of the device.

DETAILED DESCRIPTION OF THE INVENTION

In the structure of QLED device, an inorganic compound, for example a transition metal oxide, such as molybdenum oxide, vanadium oxide, tungsten oxide, and the like, has been tried as a hole injection layer. In the structure of top-emitting QLED device, a single material of molybdenum oxide is usually adopted for the hole injection layer in contact with the transparent anode electrode. However, the device has a performance highly dependent on the property of the single material, and an interfacial layer of the device has a performance greatly affected by the deposition condition and the properties of the material itself.

The specific exemplary embodiments of the present disclosure will be described in detail below with reference to the accompanying drawings. However, the present disclosure can be implemented in many other ways than those described herein, and those skilled in the art can make similar modifications without departing from the spirit of the present disclosure, and thus the present disclosure is not limited by the specific exemplary embodiments disclosed below.

It should be noted that when one piece is referred to as being "fixed to" another piece, it may be directly on another piece or there may be an intermediate piece. When one piece is considered to be "connected to" another piece, it may be directly connected to another piece or there may be an intermediate piece.

All technical and scientific terms used herein have the same meaning as commonly understood by one of ordinary skill in the art to which this disclosure belongs, unless otherwise defined. The terminology used in the description of the present disclosure is for the purpose of describing particular exemplary embodiments and is not intended to limit the present disclosure. The term "and/or" as used herein comprises any and all combinations of one or more of the associated listed items.

The present disclosure will be described in detail below with reference to the accompanying drawings.

Figure 1:
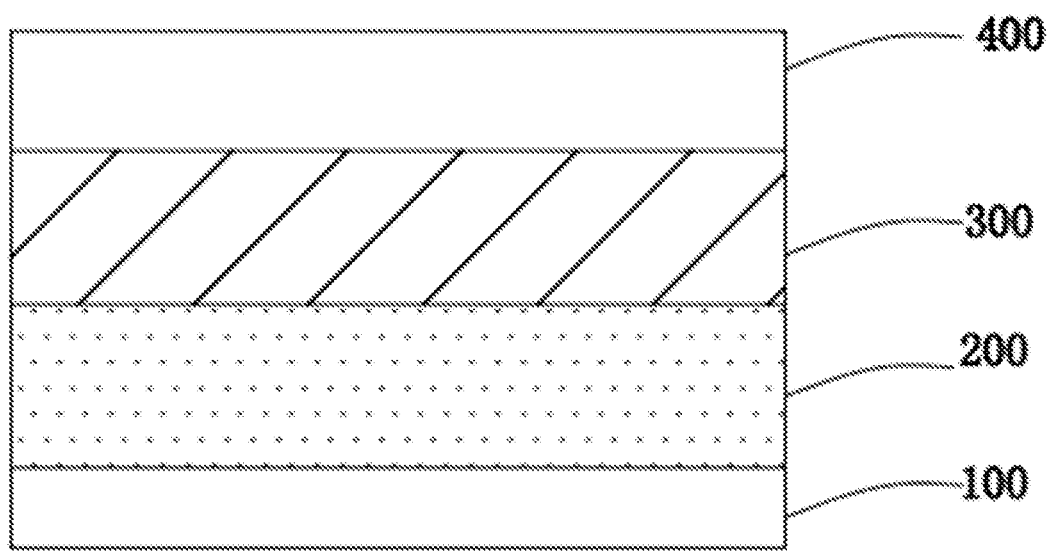
FIG. 1 is a schematic structural diagram of a light emitting device of an exemplary embodiment of the present disclosure.
Figure 2:
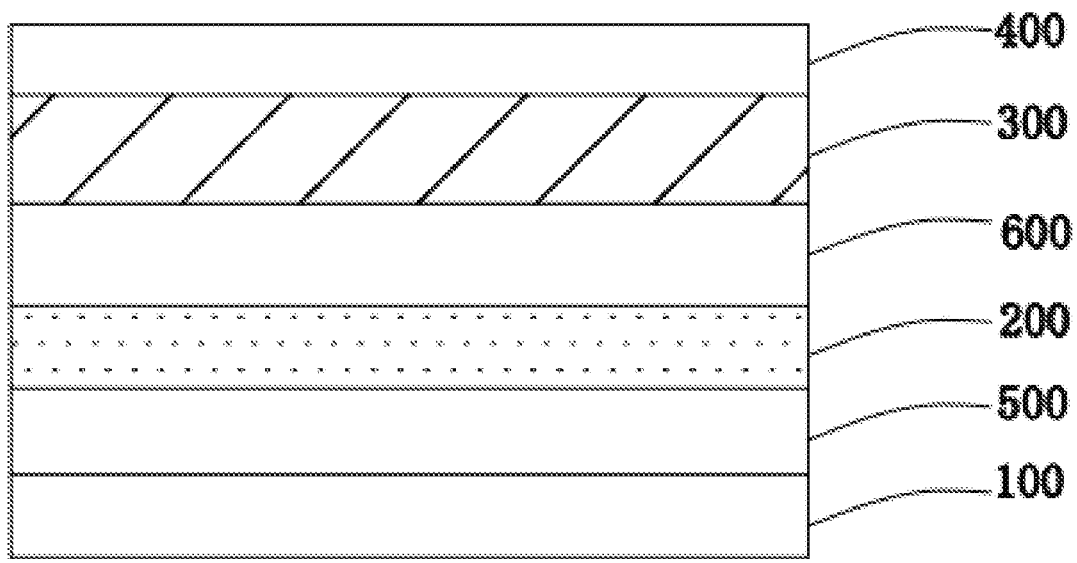
FIG. 2 is a schematic structural diagram of the light emitting device according to another exemplary embodiment of the present disclosure.

As shown in FIGS. 1 and 2, the present disclosure provides a light emitting device according to an exemplary embodiment, comprising a cathode layer 100, a quantum dot light emitting layer 200, a hole injection layer 300, and an anode layer 400 which are laminated.

In an exemplary embodiment, the hole injection layer 300 comprises a complex metal oxide film comprising two metal oxides that is at least partially oxidated.

In the above light emitting device, since the complex metal oxide film comprises at least two metal oxides, the influence of deposition condition and the property of the material itself on the single material of the hole injection layer is reduced. In addition, the synergistic effect brought by the interaction between various metal oxides can further adjust the performance of the interface and thus improve performance of the device. In addition, the partial oxidation of the two metal oxides makes them both semiconducting and metallic, and the hole injection layer thus prepared has better injection capability, greatly improving performance of the device.

In an exemplary embodiment, the metal oxide comprises at least a P-type metal oxide and an N-type metal oxide. In another exemplary embodiment, the complex metal oxide film comprises a metal oxide capable of forming a p-n heterojunction. Due to the presence of the heterojunction interface, the interface barrier can be reduced, the interfacial injection capability of the hole can be significantly improved, the influence of the single material of the hole injection layer on performance of the device can be further avoided, the influence of deposition condition and the property of the material itself on the single material of the hole injection layer is further reduced, and also the dependence of performance of the device on the property of a single material is reduced, thereby optimizing performance of the device.

In an exemplary embodiment, preparing a hole injection layer comprises first depositing a complex metal layer, and then performing at least partial oxidation treatment on the complex metal layer to form a complex metal oxide film.

Figure 3:
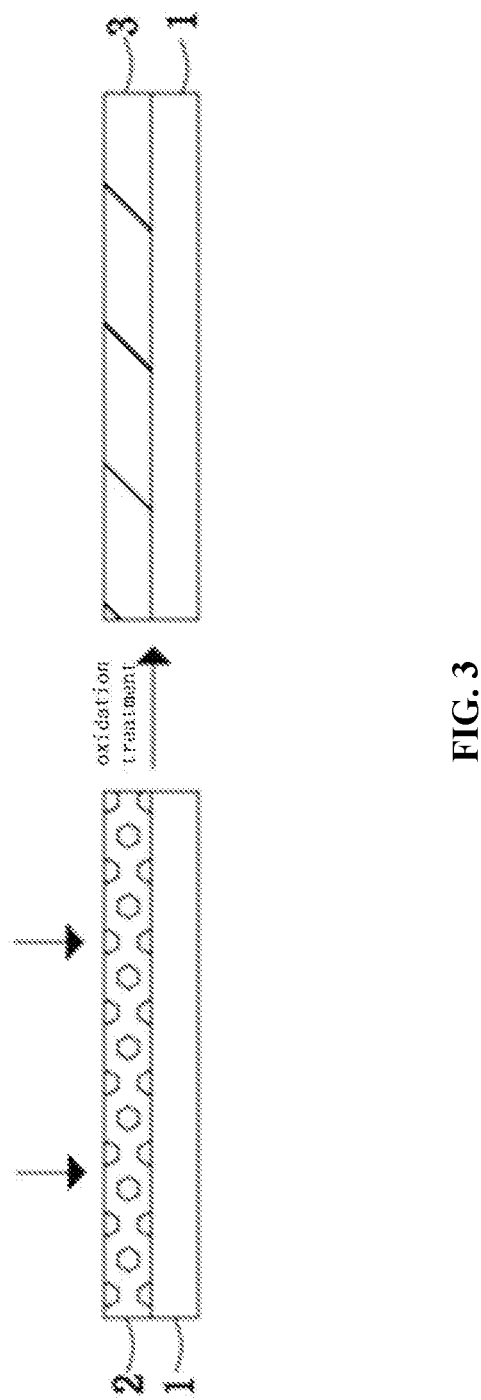
FIG. 3 is a schematic diagram showing a process for preparing a complex metal oxide film according to an embodiment of the present disclosure.

As shown in FIG. 3, depositing a complex metal oxide film on a basal plate is taken as an example to describe the preparation of the complex metal oxide film in detail.

S100. Providing a basal plate 1

In an exemplary embodiment, the basal plate 1 may be a substrate with a functional layer. At this point, subsequent deposition processes are all acted on the functional layer.

Further, the material of the substrate is not limited, and may be a material commonly used in the art, for example, a hard material or a flexible material. The hard material may be glass. The flexible material may be a flexible substrate which is an aluminum foil or a polymer film, wherein the polymer film may be a PE film, a PP film, a PI film, a PC film or the like.

Further, the functional layer may be specifically adjusted according to the type of the structure of the device. When the device is in an inversely installed structure, the functional layer comprises at least a cathode layer and a light emitting layer which are laminated and deposited.

Further, an electron transport layer and/or an electron injection layer may be deposited between the cathode layer and the light emitting layer. The light emitting layer is preferably a quantum dot light emitting layer. When the device is in an inversely installed structure, the functional layer comprises at least an anode layer.

In the present exemplary embodiment, the basal plate 1 is a substrate with a cathode layer 100 and a quantum dot light emitting layer 200.

S200. Depositing a complex metal layer 2 on the basal plate 1

Depositing the complex metal layer 2 may comprise depositing respective metals by vapor co-deposition or co-sputtering.

The metals in the complex metal layer comprise at least two metals. In an exemplary embodiment, the metals in the complex metal layer comprise at least two transition metals. The transition metals comprise, but are not limited to, molybdenum, nickel, vanadium, copper, zinc, and tungsten.

In the present exemplary embodiment, the complex metal layer comprises metal molybdenum and metal nickel. The complex metal layer can be deposited and prepared by co-sputtering. Specifically, the metal molybdenum and the metal nickel are respectively placed in a deposition apparatus, and the complex metal layer having different properties is obtained by adjusting parameters. The metal molybdenum and the metal nickel may each have a deposition rate of 2 to 20 angstroms per second. In this exemplary embodiment, the mass ratio of the metal molybdenum to the metal nickel is not limited, and the mass ratio of the two metal deposited may be between 0 and 1. The mass ratio of the two metals may be adjusted according to the performance requirements of the device. The content of the metal molybdenum and the metal nickel in the complex metal layer may be adjusted by controlling their respective depositing rates. The thickness of the complex metal layer can be adjusted depending on the deposition rates and deposition time. In this exemplary embodiment, the thickness of the complex metal layer is 5 nm to 25 nm. Surely, other thickness values may also be selected as the thickness of the complex metal layer depending on the characteristics of the material and the performance requirements of the device.

S300. At least partially oxidating the complex metal layer 2 to form a complex metal oxide film 3

The manner of oxidating the complex metal layer 2 may comprise at least one of an ozone plasma oxidation treatment, an anodization treatment, and an air annealing oxidation treatment. Preferably, the oxidation treatment is performed in a condition such that the complex metal layer is at least partially oxidated.

The surface of the complex metal layer 2 may be at least partially oxidized by the above oxidation treatment, which is advantageous for the complex metal layer to form a complete film. The influence of deposition condition and the property of the material itself on the single material of the hole injection layer may be reduced by the prepared complex metal oxide film 3.

In an exemplary embodiment, the complex metal oxide film 3 comprises a heterojunction. The heterojunction may be a p-n heterojunction formed by compositing a P-type semiconductor and an N-type semiconductor. The P-type semiconductor and the N-type semiconductor may be metal oxides, and specifically, a P-type metal oxide and an N-type metal oxide.

In a particular exemplary embodiment, the complex metal oxide film 3 comprises a P-type metal oxide and an N-type metal oxide, and the P-type metal oxide and the N-type metal oxide are capable of forming a p-n heterojunction. The above-mentioned complex metal may comprise at least two transition metals, and the respective metal oxides formed with the transition metals by oxidation may form a heterojunction if the energy level relationship is satisfied.

In an exemplary embodiment, when the complex metal layer 2 comprises metal nickel and metal molybdenum, the complex metal oxide film 3 comprises $NiO_x$ and $MoO_{3-y}$, wherein both x and y are not greater than 1. In the present exemplary embodiment, both x and y are less than 1, that is, metal nickel and metal molybdenum are only partially oxidized. The partial oxidation of the complex metal oxide film makes it both semiconducting and metallic, and the hole injection layer thus prepared has better injection capability. Surely, it should be noted that the complex metal layer may not be limited to partially oxidated nickel oxide and molybdenum oxide, and may be other combinations of metal oxide materials.

Due to the presence of the heterojunction interface, the interface barrier can be reduced, the interfacial injection capability of the hole can be significantly improved, the influence of the single material of the hole injection layer on performance of the device can be further avoided, the influence of deposition condition and the property of the material itself on the single material of the hole injection layer is further reduced, and also the dependence of performance of the device on the property of a single material is reduced, thereby optimizing performance of the device.

Different from the manner of depositing layer by layer, the complex metal layer 2 may be deposited by vapor co-deposition or co-sputtering, the respective metals in the hole injection layer thus deposited are mutually mixed, the respective metal oxides in the prepared complex metal oxide film 3 are also mutually mixed, so that more heterojunctions may be formed and more heterojunction interface is generated, which is more advantageous for improving the hole injecting capability.

In the above preparation method of the complex metal oxide film, the surface of the deposited complex metal layer may be partially oxidized in a manner of depositing before oxidating, which is advantageous for the complex metal layer to form a complete film. In addition, compared with the manner of depositing after oxidating the distance between the metals in the complex metal layer can be greatly shortened in a manner of depositing before oxidating in the present disclosure, and thus the contact interface between the metals is larger, which enhances the synergistic effect between the metals, further adjusts performance of the interface and improves performance of the device.

In an exemplary embodiment, the materials of the anode layer 400 and the cathode layer 100 may be adjusted according to the type of QLED device. Specifically, when the device is an inversely installed structure, the cathode layer 100 is a transparent electrode, and the anode layer 400 is a non-transparent electrode. When the device is a normally installed structure, the anode layer 400 is a transparent electrode, and the cathode layer 100 is a non-transparent electrode. The non-transparent electrode prevents the light emitted by the quantum dot emitting layer from being transmitted through the electrode layer, and the transparent electrode allows the light emitted by the quantum dot emitting layer to be transmitted through the electrode layer. The transparent electrode material may be a transparent material commonly used in the art, such as an indium tin oxide (ITO) material, a fluorine-doped tin oxide (FTO) material, a graphene, a carbon nanotube film, or the like. The non-transparent electrode material may be a non-transparent material commonly used in the art. For example, the anode layer 400 material may be selected from metal materials such as aluminum, silver, copper, gold, etc., and the cathode layer 100 material may comprise a metal and oxide thereof, specifically comprising but not limited to aluminum and silver.

In an exemplary embodiment, the inversely installed structure is shown as FIG. 1. The anode layer 400 may comprise at least one of gold and nickel. In the present exemplary embodiment, the anode layer 400 is a co-evaporated metal Ni/Au, and the film of the co-evaporated metal has a thickness ranging from 30 nm to 40 nm in order to obtain a translucent anode layer.

In an exemplary embodiment, in the inversely installed structure, the cathode layer 100 may be disposed on a substrate (not shown), the material of the substrate is not limited, and may be a material commonly used in the art, for example, a hard material or a flexible material. The hard material can be glass. The flexible material may be a flexible substrate which is an aluminum foil or a polymer film, wherein the polymer film may be a PE film, a PP film, a PI film, a PC film or the like.

In an exemplary embodiment, the material of the quantum dot light emitting layer 200 may be selected from quantum dot materials commonly used in the art, comprising but not limited to Group II-VI compounds and their core-shell structures, Group III-V or IV-VI semiconductor nanocrystals and their core-shell structures, for example, materials such as CdSe, CdS, CdTe, ZnSe, ZnS, InP, GaAs, GaP, or the like, or a core-shell structures formed by combining two of the above materials. The quantum dots in the quantum dot light emitting layer may be selected from at least one of red quantum dots, green quantum dots, and blue quantum dots, and the number and characteristics of the quantum dots may be selected and adjusted according to the performance of the device. In order to ensure the luminous efficiency and carrier transport efficiency of the quantum dot light emitting layer, the quantum dot light emitting layer may have a thickness ranging from 5 nm to 300 nm, preferably from 20 nm to 100 nm. Surely, the thickness of the film may not be limited to the above range as technology advances.

In an exemplary embodiment, the QLED device further comprises at least one of an electron transport layer 500, a hole transport layer 600, and an electron injection layer (not shown). This can further improve the transmission performance of carrier. In the present exemplary embodiment, as shown in FIG. 2, the QLED device comprises both the hole transport layer and the electron transport layer.

In an exemplary embodiment, the material of the electron transport layer 500 may be selected from electron transport materials commonly used in the art, comprising but not limited to the TiOx, of ZnO, of Bphen, Bepp2 and TPBi. The electron transport layer may have a thickness ranging from 5 nm to 300 nm, preferably from 20 nm to 100 nm. Surely, the thickness of the film may not be limited to the above range as technology advances.

In an exemplary embodiment, the material of the hole transport layer 600 may comprise the above complex metal oxide film. In other exemplary embodiments, the material of the hole transport layer 600 may also be selected from hole transport materials commonly used in the art, comprising but not limited to TAPC, NPB, PVK, TFB, poly-TPD and metal oxides, wherein the metal oxides comprise, but are not limited to, molybdenum oxide and nickel oxide. The hole transport layer may have a thickness ranging from 5 nm to 300 nm, preferably from 20 nm to 100 nm. Surely, the thickness of the film may not be limited to the above range as technology advances.

In an exemplary embodiment, the electron injection layer (not shown) may be disposed between the electron transport layer and the cathode, the material and thickness of the electron injection layer may be selected from electron injecting materials and thicknesses commonly used in the art.

The preparation of the light emitting device will be described in detail below by taking an inversely installed light emitting device as an example.

A method for preparing a light emitting device comprises:
providing a cathode layer,
depositing a quantum dot light emitting layer on the cathode layer,
depositing a hole injection layer on the quantum dot light emitting layer,
depositing an anode layer on the hole injection layer.

The hole injection layer comprises a complex metal oxide film comprising two metal oxides that is at least partially oxidated. Preparing a hole injection layer comprises first depositing a complex metal layer, and then performing at least partial oxidation treatment on the complex metal layer to form a complex metal oxide film. Specific preparation of the complex metal oxide film can be referred to the above, and will not be described again herein.

In an exemplary embodiment, before the quantum dot light emitting layer is deposited, the cathode layer may be subjected to cleaning treatment, specifically comprising a ultrasonic treatment in a solvent, an ultraviolet-ozone treatment, or the like to remove impurities or organic substances on the surface of the cathode layer. The above cathode layer can be prepared by methods commonly used in the art, for example, a vapor deposition method. The cathode layer can be deposited on a substrate.

In an exemplary embodiment, the deposited anode layer is co-deposited, specifically is a co-evaporated metal. In this exemplary embodiment, the anode layer is a co-evaporated metal Ni/Au, and the co-evaporated metal may have a deposition thickness of 30 nm to 40 nm.

In an exemplary embodiment, the method for preparing a light emitting device comprises at least depositing an electron injection layer and/or depositing an electron output layer before the quantum dot light emitting layer is deposited; and/or comprises at least depositing a hole transport layer before the hole injection layer is deposited.

The anode layer, the quantum dot light emitting layer, the cathode layer the hole transport layer, the electron transport layer, and the electron injection layer above may be prepared by common methods, and the respective materials and deposition thicknesses thereof are as described above, and will not be described again herein.

The present disclosure also provides a display device comprising any of the above light emitting devices.

The technical features of the above-described exemplary embodiments may be arbitrarily combined. For the sake of brevity, not all of possible combinations of the technical features in the above exemplary embodiments are described. However, the combinations of these technical features should be considered as in the scope of this specification, as long as they have no collision with each other.

It will be apparent to those skilled in the art that various modifications and improvements can be made without departing from the spirit and scope of the disclosure and all of these modifications and improvements fall into the protection scope of the present disclosure. Therefore, the scope of the disclosure should be determined by the appended claims.

The invention claimed is:

1. A light emitting device comprising: a cathode layer, a quantum dot light emitting layer, a hole injection layer and an anode layer,
    wherein the cathode layer, the quantum dot light emitting layer, the hole injection layer, and the anode layer are laminated, and
    wherein the hole injection layer comprises a heterojunction interface comprising a complex metal oxide film, the complex metal oxide film comprising at least two metal oxides, the two metal oxides characterized by partial oxidation, the heterojunction interface being characterized by an improved injection capability.

2. The light emitting device according to claim 1, wherein the metal oxide is partially oxidized.

3. The light emitting device according to claim 1, wherein the metal oxide comprises at least a P-type metal oxide and an N-type metal oxide.

4. The light emitting device according to claim 1, wherein the complex metal oxide film comprises a metal oxide capable of forming a p-n heterojunction.

5. The light emitting device according to claim 1, wherein the composite metal comprises at least two transition metals.

6. The light emitting device according to claim 5, wherein the transition metal comprises at least one of molybdenum, nickel, vanadium, copper, zinc, and tungsten.

7. The light emitting device according to claim 1, wherein the complex metal oxide film comprises NiOx and MoO3-y, wherein both x and y are not greater than 1.

8. The light emitting device according to claim 1, wherein the anode layer has a material, the material comprising at least one of gold and nickel.

9. The light emitting device according to claim 1, wherein the light emitting device further comprises at least one of an electron transport layer, an electron injection layer, and a hole transport layer.

10. A display device comprising the light emitting device according to claim 1.

11. A method for preparing a light emitting device comprising:
providing a cathode layer,
depositing a quantum dot light emitting layer on a side of the cathode layer,
depositing a hole injection layer on a side of the quantum dot light emitting layer opposite to the cathode layer, and
depositing an anode layer on a side of the hole injection layer opposite to the quantum dot light emitting layer;
wherein the hole injection layer comprises a heterojunction interface comprising a complex metal oxide film, and the complex metal oxide film comprises at least two metal oxides, the two metal oxides characterized by partial oxidation, the heterojunction interface being characterized by an improved injection capability.

12. The method according to claim 11, wherein the metal oxide is partially oxidated.

13. The method according to claim 11, wherein the depositing the hole injection layer comprises first depositing a complex metal layer, and then performing at least partial oxidation treatment on the complex metal layer to form the complex metal oxide film.

14. The method according to claim 13, wherein the depositing the complex metal layer comprises depositing respective metals by vapor co-deposition or co-sputtering.

15. The method according to claim 13, wherein the oxidation treatment comprises at least one of an ozone plasma oxidation treatment, an anodization treatment, and an air annealing oxidation treatment.

* * * * *